United States Patent
Kang et al.

(10) Patent No.: US 7,180,325 B2
(45) Date of Patent: Feb. 20, 2007

(54) DATA INPUT BUFFER IN SEMICONDUCTOR DEVICE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 78 days.

(21) Appl. No.: 11/027,631

(22) Filed: Dec. 29, 2004

(65) Prior Publication Data

US 2006/0091902 A1    May 4, 2006

(30) Foreign Application Priority Data

Oct. 30, 2004    (KR)    ............... 10-2004-0087668

(51) Int. Cl.
*H09K 19/003* (2006.01)
*H03K 17/16* (2006.01)

(52) U.S. Cl. ................... 326/23; 326/22; 326/21; 326/90; 326/86; 326/115

(58) Field of Classification Search ............ 326/21–25, 326/31–34, 86, 90, 115, 126–127
See application file for complete search history.

(56) References Cited

U.S. PATENT DOCUMENTS

| 6,288,590 | B1 | 9/2001 | Sandhu |
| 6,366,113 | B1 * | 4/2002 | Song ..................... 326/24 |
| 6,768,691 | B2 | 7/2004 | Kumazaki et al. |
| 6,768,697 | B2 | 7/2004 | Labrum et al. |
| 2003/0223303 | A1 | 12/2003 | Lamb et al. |
| 2004/0066683 | A1 | 4/2004 | Hartmann et al. |

* cited by examiner

*Primary Examiner*—Anh Q. Tran
(74) *Attorney, Agent, or Firm*—Blakely Sokoloff Taylor & Zafman

(57) ABSTRACT

A data input buffer for use in a semiconductor device, including: a detection unit for receiving a reference voltage signal and an input data signal through a first input terminal and a second input terminal respectively in order to detect a voltage level of the input data signal based on a result of comparing the input data signal with the reference voltage in response to a clock enable signal inputted through a third input terminal; and a noise elimination unit connected between the first input terminal and the third input terminal for eliminating a noise of the reference voltage signal.

10 Claims, 6 Drawing Sheets

DATA INPUT BUFFER IN SEMICONDUCTOR DEVICE

FIELD OF INVENTION

The present invention relates to a semiconductor device; and, more particularly, to a data input buffer for use in an electronic circuit.

DESCRIPTION OF PRIOR ART

Generally, a semiconductor device such as a semiconductor memory device is operated according to various input signals. That is, based on various logic levels of the input signals, operations of the semiconductor device are determined. An output signal of a semiconductor device can be used as an input signal of another semiconductor device in a same system.

An input buffer is employed for inputting an input signal to a semiconductor device by buffering the input signal. A simple type of the input buffer is a static input buffer. The static input buffer is formed by connecting a p-type metal oxide semiconductor (PMOS) transistor with an n-type metal oxide semiconductor (NMOS) transistor in series between a power supply voltage and a ground voltage having an operation of an inverter.

Although the static input buffer has a simple structure, the static input buffer requires an input signal to have a relatively long signal swing between a logic high level and a logic low level since the static input buffer is easily influenced by a noise. Therefore, the static input buffer is not suitable for an input signal having a short signal swing or a high-frequency system.

Therefore, for overcoming the above-mentioned problem of the static input buffer, a differential amplifier input buffer has been developed. The differential amplifier input buffer is usually called a dynamic input buffer.

FIG. 1 is a schematic circuit diagram showing a conventional input buffer.

As shown, the conventional input buffer includes a detection unit 10 for detecting a voltage level of a input data signal IN by comparing a voltage level of a reference voltage VREF with the voltage level of the input data signal IN; and a buffering unit 15 for buffering an output signal of the detection unit 10.

In detail, the detection unit 10 includes a first to a fourth PMOS transistors Q1 to Q4, a first to a third NMOS transistors Q5 to Q7 and an inverter IN1.

A gate of the first NMOS transistor Q5 receives the reference voltage VREF and a gate of the second NMOS transistor Q6 receives the input data signal IN.

The second PMOS transistor Q2 is connected between a power supply voltage VDD and the fifth NMOS transistor Q5 and the third PMOS transistor Q3 is connected between the power supply voltage VDD and the sixth NMOS transistor Q6. Gates of the second and the third PMOS transistors Q2 and Q3 are commonly coupled to a first node N1.

The inverter IN1 inverts a clock enable bar signal /CKE to generate a clock enable signal CKE. The third NMOS transistor Q7 is connected between sources of the first and the second NMOS transistors Q5 and Q6 and a ground voltage VSS. A gate of the third NMOS transistor Q7 receives the clock enable signal CKE.

The first PMOS transistor Q1 is connected between the power supply voltage VDD and the first node N1 and receives the clock enable signal CKE through a gate of the first PMOS transistor Q1. The fourth PMOS transistor Q4 is connected between the power supply voltage VDD and an output node N2 and receives the clock enable signal CKE through a gate of the fourth PMOS transistor Q4.

Meanwhile, the buffering unit 15 includes odd numbers of inverters for receiving an output signal of the detection unit 10 in order to generate an internal data signal BIN.

If the input data signal IN is inputted to the second NMOS transistor Q6 having a high voltage, the detection unit 10 detects that a voltage level of the input data signal IN is higher than that of the reference voltage VREF. Herein, the reference voltage has a constant voltage level, i.e., about half of the power supply voltage VDD. The reference voltage VREF is inputted to a semiconductor device through a particular input pin by an external circuit or is internally generated in the semiconductor device.

The first PMOS transistor Q5 receiving the reference voltage VREF has a constant current, i.e., a first current i1 flown on the first PMOS transistor Q5. A second current i2 flown on the second NMOS transistor Q6 is varied according to a voltage level of the input data signal IN. The detection unit 10 determines a voltage level of the output node N2 based on a result of comparing the first current i1 with the second current i2.

When the clock enable bar signal /CKE is activated as a logic low level, the third NMOS transistor Q7 is turned on and the first and the fourth PMOS transistors Q1 and Q4 are turned off. Thus, the detection unit 10 is normally operated.

Thereafter, when the clock enable bar signal /CKE is inactivated as a logic high level, the third NMOS transistor Q7 is turned off and the detection unit 10 is disabled. The first and the fourth PMOS transistors Q1 and Q4 are turned off precharging the first node N1 and the output node N2 as a logic high level respectively. Therefore, a current flow in the detection unit 10 is prevented for reducing power consumption.

Herein, when the clock enable bar signal /CKE is activated as a logic low level again, i.e., when the clock enable signal CKE is activated as a logic high level, a voltage level of the first node N1 is lowered from the power supply voltage VDD to a half voltage of the power supply voltage VDD. At this time, the voltage variation of the first node N1 causes a coupling noise of the reference voltage VREF since there is a parasitic capacitance C_N1 between the first node N1 and an input terminal of the reference voltage VREF.

FIG. 2 is a timing diagram showing variations of the reference voltage VREF according to the clock enable signal CKE after precharging the input terminal of the reference voltage REF by using a capacitor having a constant capacitance.

When the clock enable signal CKE is changed from a logic low level to a logic high level, a voltage level of the reference voltage VREF is sloped downward due to the parasitic capacitance C_N1. On the contrary, when the clock enable signal CKE is changed from a logic low level to a logic high level, a voltage level of the reference voltage VREF is sloped upward due to the parasitic capacitance C_N1. Therefore, according to the conventional input buffer, it is difficult to eliminate the coupling noise of the reference voltage VREF.

Generally, for a high-speed data transmission, a data signal swing width from a high level to a low level is required to be short. In addition, also for reducing power consumption, a short signal swing width is desired.

FIG. 3 is a timing diagram showing variations of the reference voltage VREF and a data signal. Herein, it is assumed that a signal swing width of the data signal is very small having a value of about 200 mV. A valid data eye of the data signal is decreased as the signal swing width is decreased.

As shown in the case (A), if the reference voltage VREF ideally has a constant voltage level, i.e., has no noise, a correct logic level of the data signal can be easily detected even if the signal swing width is very small.

However, as shown in the case (A), if the reference voltage VREF is fluctuated due to a noise, it is difficult to detect a correct logic level of the data signal because of the small signal swing width of the data signal.

Meanwhile, generally, a data input buffer includes a plurality of input buffers each of which commonly receives the reference voltage VREF and the clock enable bar signal /CKE as shown in FIG. 4. If a noise is generated from one of the plurality of input buffers, the noise may cause other noises of the other input buffers.

SUMMARY OF INVENTION

It is, therefore, an object of the present invention to provide a data input buffer capable of eliminating a noise of a reference voltage.

In accordance with an aspect of the present invention, there is provided a data input buffer for use in a semiconductor device, including: a detection unit for receiving a reference voltage signal and an input data signal through a first input terminal and a second input terminal respectively in order to detect a voltage level of the input data signal based on a result of comparing the input data signal with the reference voltage in response to a clock enable signal inputted through a third input terminal; and a noise elimination unit connected between the first input terminal and the third input terminal for eliminating a noise of the reference voltage signal.

In accordance with another aspect of the present invention, there is provided a data input buffer for use in a semiconductor device, including: a first NMOS transistor whose one end is connected to a first node for receiving a reference voltage signal through a gate of the first NMOS transistor; a second NMOS transistor whose one end is connected to a second node for receiving an input data signal through a gate of the second NMOS transistor; a third NMOS transistor connected between the first and the second NMOS transistors and a ground voltage for receiving a clock enable signal through a gate of the third NMOS transistor; a first PMOS transistor connected between a power supply voltage and the first node for receiving the clock enable signal through a gate of the first PMOS transistor; a second PMOS transistor whose one end is connected to the power supply voltage and the other end and a gate are commonly coupled to the first node; a third PMOS transistor connected between the power supply voltage and the second node; a fourth PMOS transistor connected between the power supply voltage and the second node; and a capacitive element connected between the gate of the first NMOS transistor and the gate of the third NMOS transistor.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data input buffer in accordance with the present invention will be described in detail referring to the accompanying drawings.

Figure 5:
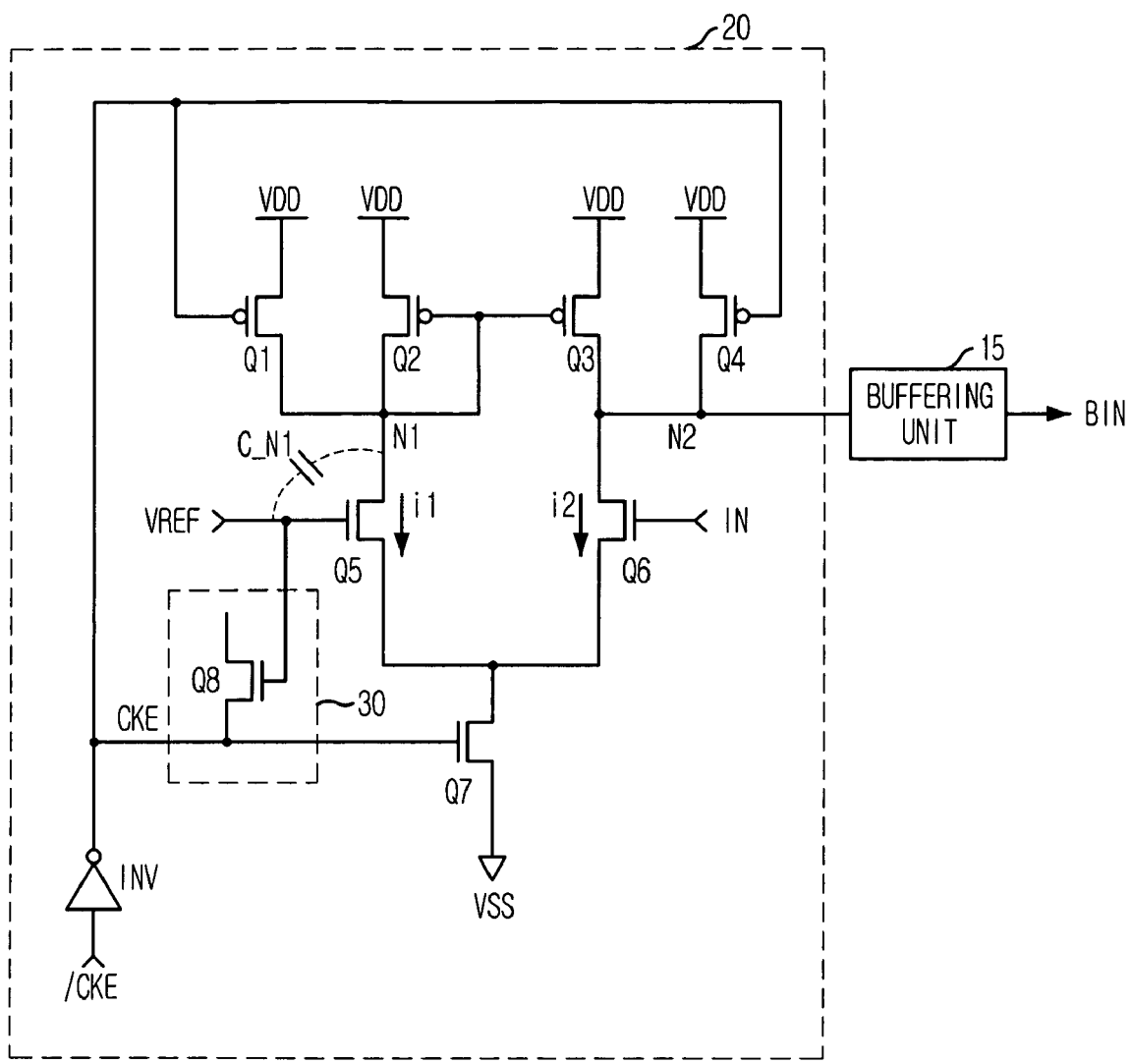
FIG. 5 is a schematic circuit diagram showing a data input buffer in accordance with a preferred embodiment of the present invention.

FIG. 5 is a schematic circuit diagram showing a data input buffer in accordance with a preferred embodiment of the present invention.

As shown, the data input buffer includes a detection unit 20 including a metal oxide semiconductor (MOS) type differential amplifier for detecting a voltage level of an input data signal IN comparing the voltage level of the input data signal IN with a voltage level of the reference voltage VREF; and a buffering unit 15 for buffering an output signal of the detection unit 15 to generate an internal data signal BIN.

The detection unit 20 includes a first to a fourth p-type metal oxide semiconductor (PMOS) transistors Q1 to Q4, a first to a third n-type metal oxide semiconductor (NMOS) transistors Q5 to Q7, an inverter INV and a noise elimination unit 30.

A gate of the first NMOS transistor Q5 receives the reference voltage VREF and a gate of the second NMOS transistor Q6 receives the input data signal IN.

The second PMOS transistor Q2 is connected between a power supply voltage VDD and the fifth NMOS transistor Q5 and the third PMOS transistor Q3 is connected between the power supply voltage VDD and the sixth NMOS transistor Q6. Gates of the second and the third PMOS transistors Q2 and Q3 are commonly coupled to a first node N1.

The inverter INV inverts a clock enable bar signal /CKE to generate a clock enable signal CKE. The third NMOS transistor Q7 is connected between sources of the first and the second NMOS transistors Q5 and Q6 and a ground voltage VSS. A gate of the third NMOS transistor Q7 receives the clock enable signal CKE.

The first PMOS transistor Q1 is connected between the power supply voltage VDD and the first node N1 and receives the clock enable signal CKE through a gate of the first PMOS transistor Q1. The fourth PMOS transistor Q4 is connected between the power supply voltage VDD and an output node N2 and receives the clock enable signal CKE through a gate of the fourth PMOS transistor Q4.

The noise elimination unit 30 is connected between an input terminal of the reference voltage VREF and the gate of the third NMOS transistor Q7.

The buffering unit 15 includes odd numbers of CMOS inverters connected in series for buffering the output signal of the detection unit 15.

The noise elimination unit 30 includes a fourth NMOS transistor Q8. A gate of the fourth NMOS transistor Q8 is coupled to the input terminal of the reference voltage VREF and one terminal of the fourth NMOS transistor Q8 is coupled to the gate of the third NMOS transistor Q7. The other terminal of the fourth NMOS transistor Q8 is floated. Herein, a gate capacitance of the fourth NMOS transistor Q8 is half of a capacitance of a parasitic capacitor C_N1. That is, since it is assumed that a signal swing width at the first node N1 according to a transition of the clock enable signal CKE is half of a signal swing width of the clock enable signal CKE, the gate capacitance of the fourth NMOS transistor Q8 is adjusted to have half of the capacitance of the parasitic capacitor C_N1 so that coupling charges generated by the parasitic capacitor C_N and the gate capacitance can be equal.

Operations of the data input buffer are described below referring to FIG. 5.

Figure 1:
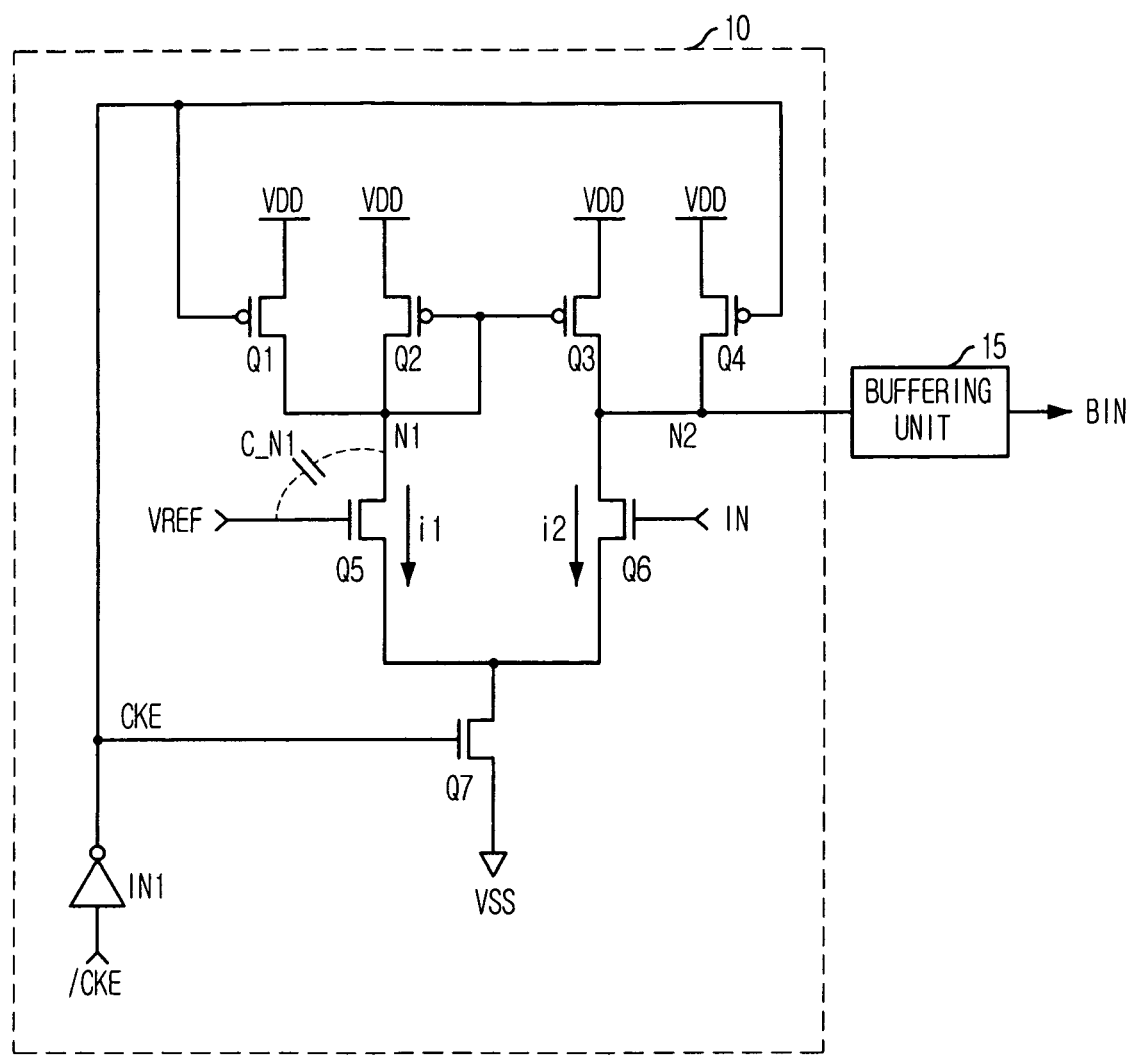
FIG. 1 is a schematic circuit diagram showing a conventional input buffer.
Figure 2:
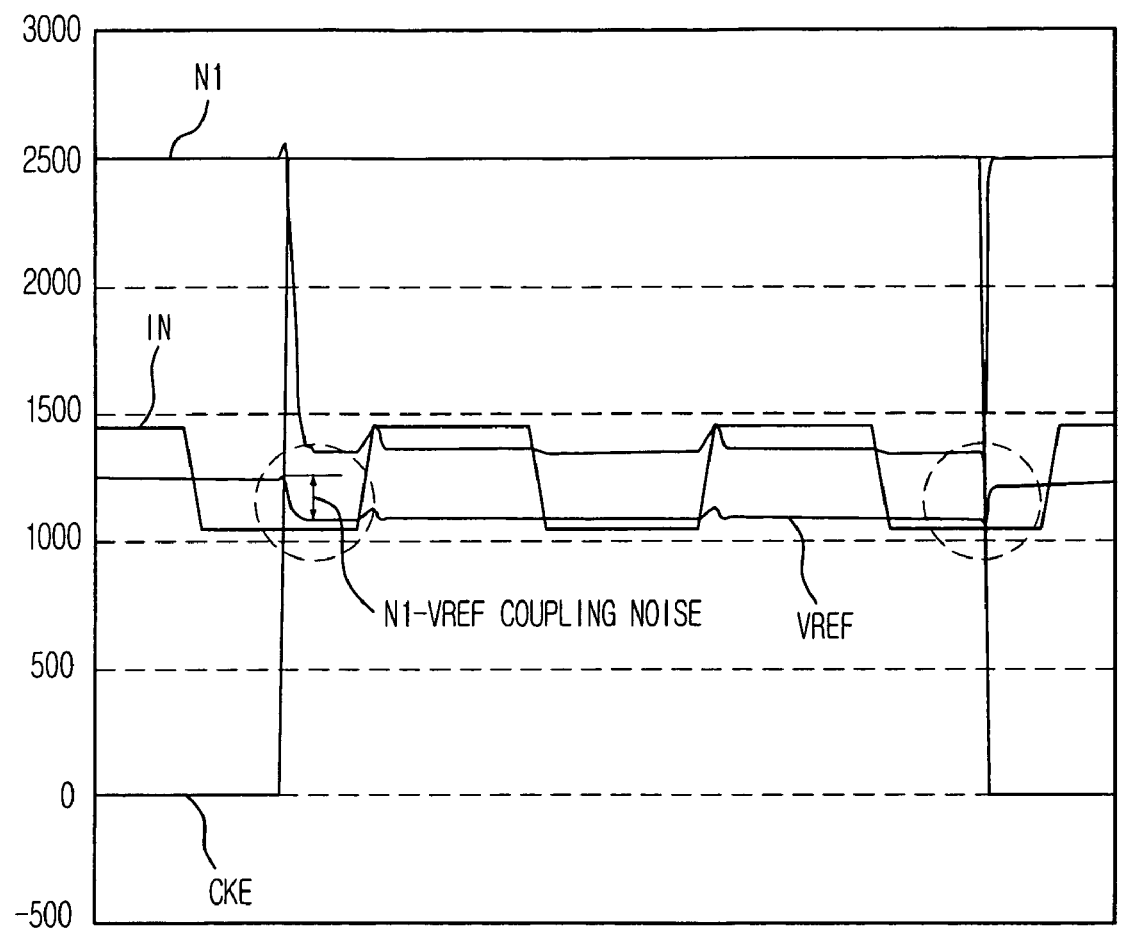
FIG. 2 is a timing diagram showing variations of a reference voltage according to a clock enable signal.
Figure 3:
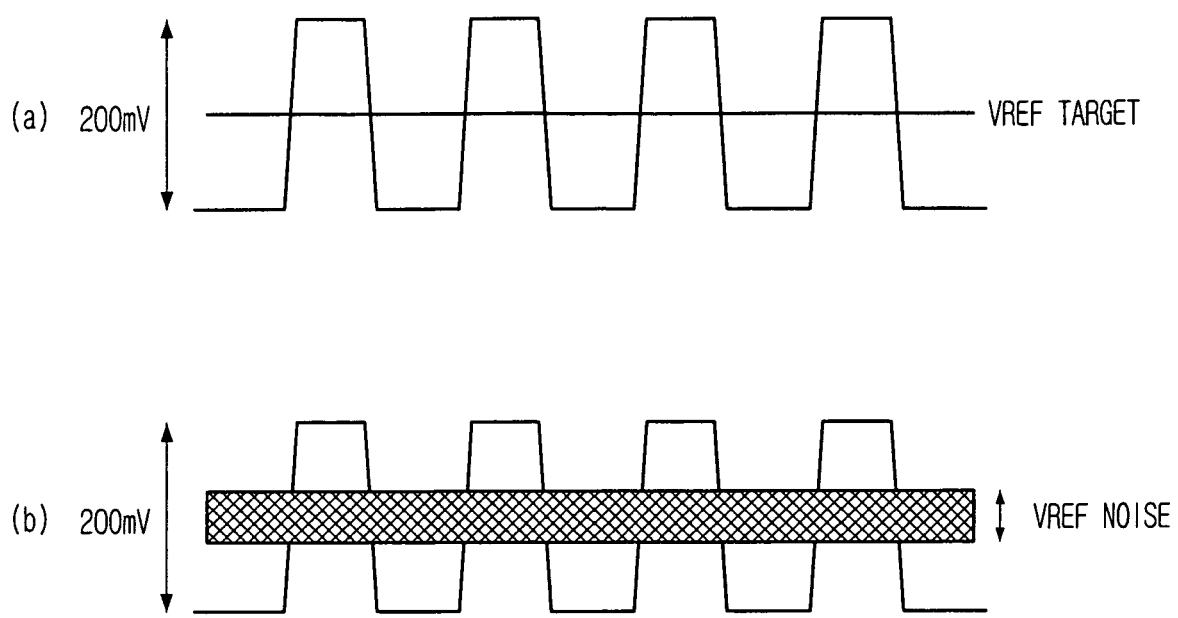
FIG. 3 is a timing diagram showing variations of the reference voltage and a data signal.
Figure 4:
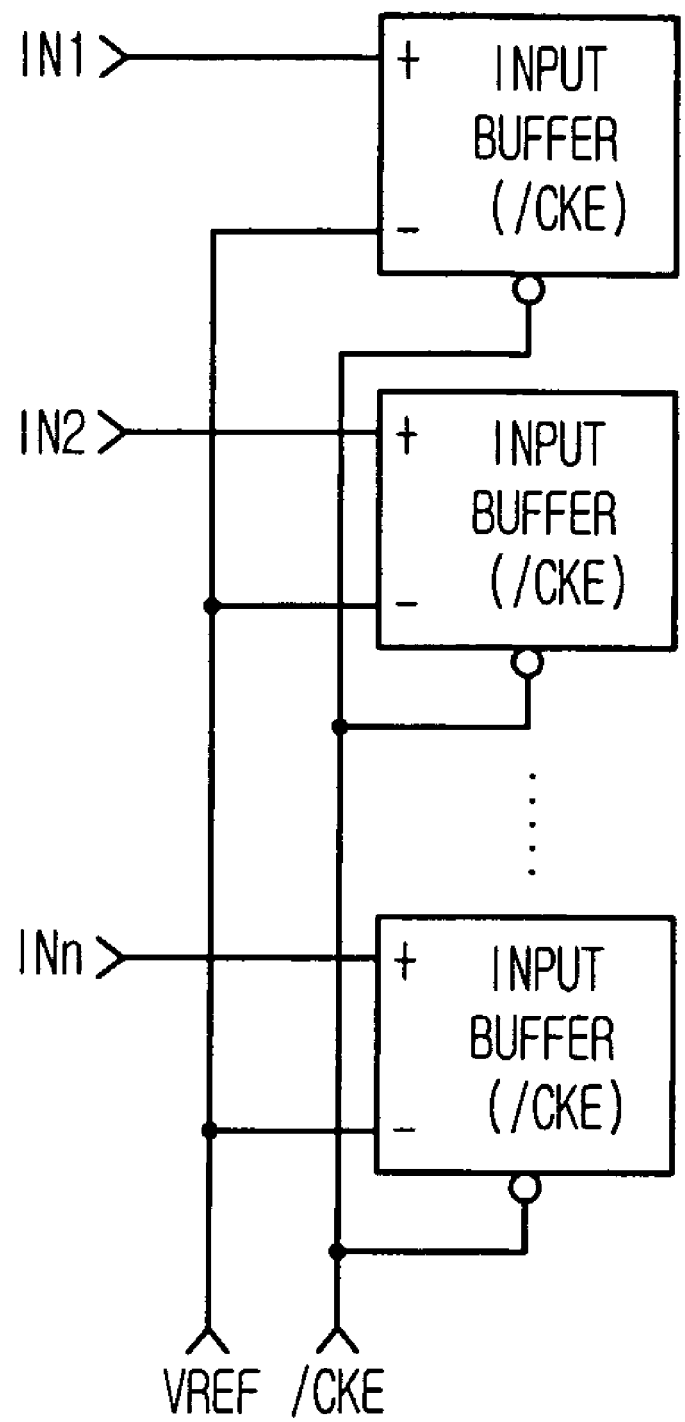
FIG. 4 is a block diagram showing a data input buffer unit including a plurality of input buffers.

Operations of the detection unit 20 according to the input data signal IN are similar to those of the detection unit 10 shown in FIG. 1.

That is, when the clock enable bar signal /CKE is activated as a logic low level, the third NMOS transistor Q7 is turned on and the first and the fourth PMOS transistors Q1 and Q4 are turned off. Thus, the detection unit 20 is normally operated to determine a voltage level of the output node N2 based on a result of comparing a first current i1 flown on the first NMOS transistor Q5 and a second current i2 flown on the second NMOS transistor Q6.

Thereafter, when the clock enable bar signal /CKE is inactivated as a logic high level, the third NMOS transistor Q7 is turned off and the detection unit 20 is disabled. The first and the fourth PMOS transistors Q1 and Q4 are turned off precharging the first node N1 and the output node N2 as a logic high level respectively.

Herein, when the clock enable bar signal /CKE is activated as a logic low level again, i.e., when the clock enable signal CKE is activated as a logic high level, a voltage level of the first node N1 is lowered from the power supply voltage VDD to a half voltage of the power supply voltage VDD. At this time, the voltage variation of the first node N1 causes a coupling noise of the reference voltage VREF since there is the parasitic capacitance C_N1 between the first node N1 and the input terminal of the reference voltage VREF. However, the coupling noise of the reference voltage VREF is eliminated by the gate capacitance of the fourth NMOS transistor Q8.

Figure 6:
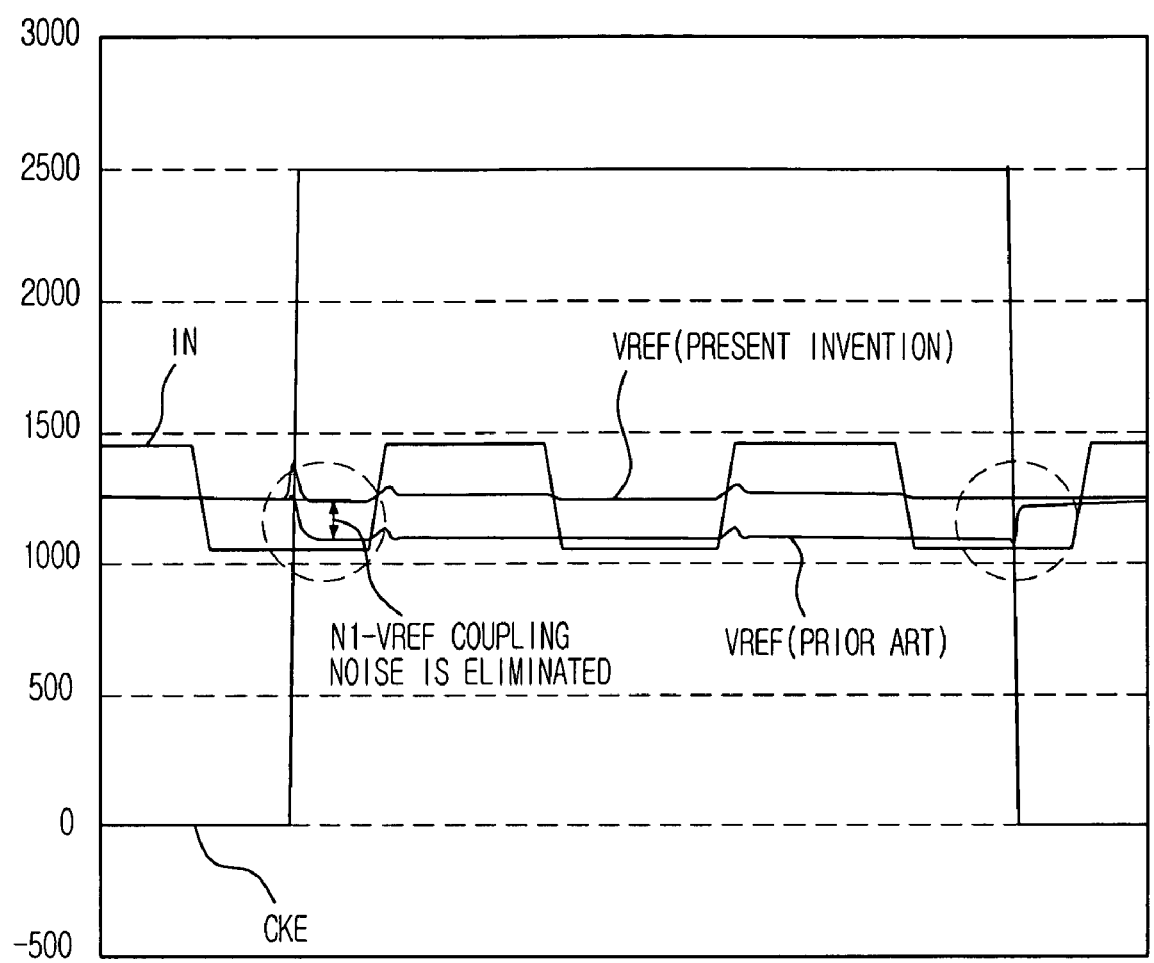
FIG. 6 is a timing diagram showing variations of a reference voltage according to a clock enable signal shown in FIG. 5.

FIG. 6 is a timing diagram showing variations of the reference voltage VREF according to the clock enable signal CKE after precharging the input terminal of the reference voltage REF by using a capacitor having a constant capacitance.

When the clock enable signal CKE is changed from a logic low level to a logic high level, a voltage level of the reference voltage VREF is lowered by the capacitance of the parasitic capacitor C_N1. However, at this time, the voltage level of the reference voltage VREF is also raised by the gate capacitance of the fourth NMOS transistor Q8. Therefore, since the coupling charges generated by the parasitic capacitor C_N1 and the gate capacitance are the same, the voltage level of the reference voltage VREF is not changed holding a constant voltage level.

Similarly, when the clock enable signal CKE is changed from a logic high level to a logic low level, a voltage level of the reference voltage VREF is raised by the capacitance of the parasitic capacitor C_N1. However, at this time, the voltage level of the reference voltage VREF is also lowered by the gate capacitance of the fourth NMOS transistor Q8.

Therefore, as above-mentioned, the voltage level of the reference voltage VREF is not changed holding a constant voltage level.

Although the preferred embodiment is described assuming that the gate capacitance of the fourth NMOS transistor Q8 is half of the parasitic capacitance, the gate capacitance of the forth NMOS transistor Q8 can have other values for generating same coupling charges of the parasitic capacitance and the gate capacitance. For this purpose, an equation shown below can be applied.

$$Q = CV \qquad \text{Eq. 1}$$

Herein, Q is a coupling charge, C is a capacitance and V is a voltage between terminals of a capacitor.

In addition, although the preferred embodiment employs an NMOS transistor as the noise elimination unit, another capacitive element such as a PMOS transistor can be adopted fro the noise elimination unit.

Further, although the preferred embodiment forms the detection unit as an NMOS type differential amplifier, i.e., current mirroring transistors are connected to the power supply voltage and a bias transistor is connected to the ground voltage, a PMOS type differential amplifier also can be employed for the detection unit providing a bias transistor and current mirroring transistors to the power supply voltage and the ground voltage respectively. In this case, the clock enable bar signal /CKE can be directly inputted to gates of MOS transistors placed at the same positions Q1, Q4 and Q8 shown in FIG. 5.

As a result, in accordance with the present invention, a coupling noise of a reference voltage generated due to a parasitic capacitance can be eliminated. Therefore, even though a data signal swing width is decreased for reducing power consumption, an enough data sensing margin time can be obtained.

The present application contains subject matter related to Korean patent application No. 2004-87668, filed in the Korean Patent Office on Oct. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data input buffer for use in a semiconductor device, comprising:

a detection unit for receiving a reference voltage signal and an input data signal through a first input terminal and a second input terminal respectively in order to detect a voltage level of the input data signal based on a result of comparing the input data signal with the reference voltage in response to a clock enable signal inputted through a third input terminal; and a capacitive element including an elimination noise metal oxide semiconductor (MOS) transistor whose gate and one end are respectively connected to the first input terminal and the third input terminal for eliminating a noise of the reference voltage signal.

2. The data input buffer as recited in claim 1, wherein the detection unit is a MOS type differential amplifier having a current mirroring node, an output node and a bias transistor.

3. The data input buffer as recited in claim 2, wherein a gate capacitance of the elimination noise MOS transistor generates a coupling charge amount which is substantially same to a coupling charge amount generated by a parasitic capacitance between the current mirroring node and the first input terminal.

4. A data input buffer for use in a semiconductor device, comprising: a first NMOS transistor whose one end is connected to a first node for receiving a reference voltage signal through a gate of the first NMOS transistor; a second NMOS transistor whose one end is connected to a second node for receiving an input data signal through a gate of the second NMOS transistor; a third NMOS transistor connected between the first and the second NMOS transistors and a ground voltage for receiving a clock enable signal through a gate of the third NMOS transistor; a first PMOS transistor connected between a power supply voltage and the first node for receiving the clock enable signal through a gate of the first PMOS transistor; a second PMOS transistor whose one end is connected to the power supply voltage and the other end and a gate are commonly coupled to the first node; a third PMOS transistor connected between the power supply voltage and the second node; a fourth PMOS transistor connected between the power supply voltage and the second node; and a capacitive element connected between the gate of the first NMOS transistor and the gate of the third NMOS transistor.

5. The data input buffer as recited in claim 4, wherein the capacitive element is an NMOS transistor whose one end and gate are respectively connected to the gate of the third NMOS transistor and the gate of the first NMOS transistor.

6. The data input buffer as recited in claim 5, wherein a gate capacitance of the NMOS transistor generates a coupling charge amount which is substantially same to a coupling charge amount generated by a parasitic capacitance between the current mirroring node and the first input terminal.

7. The data input buffer as recited in claim 6, further comprising: a buffering unit coupled to the second node for buffering an output signal of the second node.

8. The data input buffer as recited in claim 7, wherein the buffering unit includes odd numbers of inverters connected in series.

9. The data input buffer as recited in claim 1, where the detection unit includes:
   a first NMOS transistor connected to a first node and including a gate receiving the reference voltage signal;
   a second NMOS transistor connected to a second node and including a gate receiving the input data signal;
   a third NMOS transistor connected between a common node of the first and the second NMOS transistors and a ground voltage terminal, and including a gate receiving the clock enable signal
   a first PMOS transistor connected between a power supply voltage terminal and the first node, and including a gate receiving the clock enable signal;
   a second PMOS transistor connected between the power supply voltage terminal and the first node, and including a gate commonly coupled to the first node;
   a third PMOS transistor connected between the power supply voltage terminal and the second node, and including a gate coupled to the first node; and
   a fourth PMOS transistor connected between the power supply voltage terminal and the second node, and including a gate receiving the clock enable signal.

10. The data input buffer as recited in claim 9, wherein the elimination noise MOS transistor is an n-type MOS transistor.

* * * * *